United States Patent
Kawaguchi et al.

(10) Patent No.: US 8,163,813 B2
(45) Date of Patent: Apr. 24, 2012

(54) PHOTOCURABLE COMPOSITION AND METHOD FOR PRODUCING MOLDED PRODUCT WITH FINE PATTERN

(75) Inventors: Yasuhide Kawaguchi, Chiyoda-ku (JP); Kentaro Tsunozaki, Chiyoda-ku (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 12/542,086

(22) Filed: Aug. 17, 2009

(65) Prior Publication Data

US 2010/0038831 A1    Feb. 18, 2010

Related U.S. Application Data

(63) Continuation of application No. PCT/JP2008/052373, filed on Feb. 13, 2008.

(30) Foreign Application Priority Data

Jun. 20, 2007    (JP) .................................. 2007-162466

(51) Int. Cl.
    *C08F 2/50* (2006.01)
    *C08J 3/28* (2006.01)

(52) U.S. Cl. ........ 522/100; 522/102; 522/103; 522/113; 522/114; 522/131; 522/120; 522/121; 522/130; 522/132; 522/178; 522/181; 522/182; 522/184; 522/186; 522/187; 522/155; 522/156; 522/153; 264/494; 264/496

(58) Field of Classification Search .................. 522/109, 522/110, 111, 112, 113, 114, 120, 121, 130, 522/131, 132, 178, 182, 184, 186, 187; 156/496; 264/494, 495, 496

See application file for complete search history.

(56) References Cited

U.S. PATENT DOCUMENTS

| | | | |
|---|---|---|---|
| 4,814,257 A * | 3/1989 | Galloway | 430/270.14 |
| 5,004,790 A * | 4/1991 | Harnish et al. | 526/242 |
| 5,609,990 A * | 3/1997 | Ha et al. | 430/270.11 |
| 6,696,220 B2 | 2/2004 | Bailey et al. | |
| 7,935,472 B2 * | 5/2011 | Ogino et al. | 430/270.1 |
| 2007/0065757 A1 | 3/2007 | Ogino et al. | |
| 2008/0107870 A1 * | 5/2008 | Kawaguchi et al. | 428/156 |

FOREIGN PATENT DOCUMENTS

| | | |
|---|---|---|
| DE | 197 06 515 A1 | 8/1998 |
| JP | 08-239430 | 9/1996 |
| JP | 2004-051790 | 2/2004 |
| JP | 2004-071934 | 3/2004 |
| JP | 2006-306951 | 11/2006 |
| JP | 2007-084625 | 4/2007 |
| JP | 2007-137998 | 6/2007 |
| WO | WO 00/35980 A1 | 6/2000 |
| WO | 2006-030625 | 3/2006 |
| WO | 2006-082845 | 8/2006 |
| WO | 2006-114958 | 11/2006 |
| WO | 2007-020901 | 2/2007 |
| WO | 2008-015876 | 2/2008 |

OTHER PUBLICATIONS

U.S. Appl. No. 12/888,936, filed Sep. 23, 2010, Kawaguchi.
Extended European Search Report issued Nov. 22, 2010, in European Patent Application No. 08711219.9.

* cited by examiner

*Primary Examiner* — Sanza McClendon (74) *Attorney, Agent, or Firm* — Oblon, Spivak, McClelland, Maier & Neustadt, L.L.P.

(57) ABSTRACT

To provide a photocurable composition from which a cured product excellent in mold release characteristics and mechanical strength can be obtained, and a method for producing a molded product excellent in durability, with a fine pattern having a reverse pattern of a mold precisely transferred on its surface.

A photocurable composition 20 comprising from 15 to 60 mass % of a compound (A) which is an aromatic compound having at least two rings or an alicyclic compound having at least two rings and which has two (meth)acryloyloxy groups, from 5 to 40 mass % of a compound (B) having a fluorine atom and having at least one carbon-carbon unsaturated double bond (excluding the compound (A)), from 10 to 55 mass % of a compound (C) having one (meth)acryloyloxy group (excluding the compound (B)) and from 1 to 12 mass % of a photopolymerization initiator (D) (provided that (A)+(B)+(C)+(D)=100 mass %) is used.

21 Claims, 2 Drawing Sheets

PHOTOCURABLE COMPOSITION AND METHOD FOR PRODUCING MOLDED PRODUCT WITH FINE PATTERN

TECHNICAL FIELD

The present invention relates to a photocurable composition and a method for producing a molded product with a fine pattern on its surface.

BACKGROUND ART

As a method of forming a fine pattern in a short time in production of optical members, recording media, semiconductor apparatus, etc., a method (a nanoimprint method) has been known of pressing a mold having a pattern reverse of the fine pattern on its surface on a photocurable composition disposed on the surface of a substrate and irradiating the photocurable composition with light to cure the photocurable composition thereby to form a fine pattern on the surface of the substrate (Patent Documents 1 and 2).

However, in this method, since the cured product of the photocurable composition is attached to the mold, it is difficult to separate the cured product and the mold. Accordingly, it is necessary to apply a mold release agent to the surface of the mold. However, it will be difficult to precisely transfer the reverse pattern of the mold due to the thickness of the mold release agent itself, uneven coating of the mold release agent, etc.

As a photocurable composition from which a cured product with fine mold release characteristics can be formed, the following has been proposed.

(1) A photocurable composition comprising a fluorinated monomer, a monomer containing no fluorine, a fluorinated surfactant or a fluoropolymer, and a polymerization initiator (Patent Document 3).

However, a cured product of the photocurable composition (1) contains a fluoromonomer and a fluorinated surfactant or a fluoropolymer and thereby has low mechanical strength. In order to obtain a molded product having a fine pattern in nanometer order, durability with which the pattern shape is maintained is required. Accordingly, a photocurable composition from which a cured product with high mechanical strength can be obtained has been required. Further, in production of semiconductor apparatus also, a resist is required to have high dry etching resistance and in addition, particularly for a fine pattern at the nano level, a photocurable composition from which a cured product with high mechanical strength to maintain the pattern shape can be obtained has been required.

Patent Document 1: U.S. Pat. No. 6,696,220
Patent Document 2: JP-A-2004-071934
Patent Document 3: WO2006/114958

DISCLOSURE OF THE INVENTION

Object to be Accomplished by the Invention

The object of the present invention is to provide a photocurable composition from which a cured product excellent in mold release characteristics and mechanical strength can be obtained, and a method for producing a molded product excellent in durability, with a fine pattern having a reverse pattern of a mold precisely transferred on its surface.

Means to Accomplish the Object

The photocurable composition of the present invention is characterized by comprising a compound (A) which is an aromatic compound having at least two rings or an alicyclic compound having at least two rings and which has two (meth)acryloyloxy groups, a compound (B) having a fluorine atom and having at least one carbon-carbon unsaturated double bond (excluding the compound (A)), a compound (C) having one (meth)acryloyloxy group (excluding the compound (B)) and a photopolymerization initiator (D), in amounts of the compound (A) of from 15 to 60 mass %, the compound (B) of from 5 to 40 mass %, the compound (C) of from 10 to 55 mass % and the photopolymerization initiator (D) of from 1 to 12 mass % based on the total amount (100 mass %) of the compound (A), the compound (B), the compound (C) and the photopolymerization initiator (D).

The photocurable composition of the present invention preferably contains substantially no solvent.

The photocurable composition of the present invention preferably further contains a compound (E) having two (meth)acryloyloxy groups (excluding the compounds (A) and (B)) in an amount of from 5 to 30 parts by mass per 100 parts by mass of the total amount of the compound (A), the compound (B), the compound (C) and the photopolymerization initiator (D).

The photocurable composition of the present invention preferably further contains a compound (F) having at least three (meth)acryloyloxy groups (excluding the compound (B)) in an amount of from 5 to 90 parts by mass per 100 parts by mass of the total amount of the compound (A), the compound (B), the compound (C) and the photopolymerization initiator (D).

The photocurable composition of the present invention preferably further contains a fluorinated surfactant (G) in an amount of from 0.1 to 3 parts by mass per 100 parts by mass of the total amount of the compound (A), the compound (B), the compound (C) and the photopolymerization initiator (D), the amount of the compound (B) being from 0.5 to 100 times the total mass of the fluorinated surfactant (G).

The photocurable composition of the present invention preferably further contains a fluoropolymer (H) in an amount of from 5 to 25 parts by mass per 100 parts by mass of the total amount of the compound (A), the compound (B), the compound (C) and the photopolymerization initiator (D), the amount of the compound (B) being from 0.5 to 100 times the total mass of the fluoropolymer (H).

The method for producing a molded product with a fine pattern on its surface of the present invention is characterized by comprising a step of bringing the photocurable composition of the present invention into contact with the surface with a pattern reverse of the fine pattern of a mold having the reverse pattern formed on its surface, a step of irradiating the photocurable composition with light in a state where the photocurable composition is in contact with the surface of the mold to cure the photocurable composition thereby to obtain a cured product, and a step of separating the mold from the cured product to obtain the molded product with a fine pattern on its surface.

The method for producing a molded product with a fine pattern on its surface of the present invention is characterized by comprising a step of disposing the photocurable composition of the present invention to the surface of a substrate, a step of pressing a mold having a pattern reverse of the fine pattern on its surface on the photocurable composition so that the reverse pattern of the mold is in contact with the photocurable composition, a step of irradiating the photocurable composition with light in a state where the mold is pressed on the photocurable composition to cure the photocurable composition thereby to obtain a cured product, and a step of separating the mold, or the substrate and the mold, from the cured product to obtain the molded product with a fine pattern on its surface.

The method for producing a molded product with a fine pattern on its surface of the present invention is characterized by comprising a step of disposing the photocurable composition of the present invention to the surface with a pattern reverse of the fine pattern of a mold having the reverse pattern formed on its surface, a step of pressing a substrate on the photocurable composition, a step of irradiating the photocurable composition with light in a state where the substrate is pressed on the photocurable composition to cure the photocurable composition thereby to obtain a cured product, and a step of separating the mold, or the substrate and the mold, from the cured product to obtain the molded product with a fine pattern on its surface.

The method for producing a molded product with a fine pattern on its surface of the present invention is characterized by comprising a step of bringing a substrate and a mold having a pattern reverse of the fine patter on its surface into close to or into contact with each other so that the reverse pattern of the mold is on the substrate side, a step of filling the photocurable composition of the present invention between the substrate and the mold, a step of irradiating the photocurable composition with light in a state where the substrate and the mold are close to or in contact with each other to cure the photocurable composition thereby to obtain a cured product, and a step of separating the mold, or the substrate and the mold, from the cured product to obtain the molded product with a fine pattern on its surface.

Effect of the Invention

According to photocurable composition of the present invention, a cured product excellent in mold release characteristics and mechanical strength can be obtained.

According to the method for producing a molded product with a fine pattern on its surface, a molded product excellent in durability, with a fine pattern having a reverse pattern of a mold precisely transferred on its surface, can be produced.

MEANINGS OF SYMBOLS

10: mold
12: reverse pattern
20: photocurable composition
30: substrate
40: molded product
42: cured product
44: fine pattern

BEST MODE FOR CARRYING OUT THE INVENTION

In the present specification, a compound represented by the formula (A1) will be referred to as a compound (A1). The same applies to compounds represented by other formulae. Further, in the present specification, a (meth)acryloyloxy group means an acryloyloxy group or a methacryloyloxy group. Further, in the present specification, a (meth)acrylate means an acrylate or a methacrylate.

(Photocurable Composition)

The photocurable composition of the present invention is a composition comprising compound (A) to (C) and a photopolymerization initiator (D) and as the case requires, further containing a compound (E), a compound (F), a fluorinated surfactant (G), a fluoropolymer (H) or other additives.

Compound (A): A compound which is an aromatic compound having at least two rings or an alicyclic compound having at least two rings and which has two (meth)acryloyloxy groups.

Compound (B): A compound having a fluorine atom and having at least one carbon-carbon unsaturated double bond (excluding the compound (A)).

Compound (C): A compound having one (meth)acryloyloxy group (excluding the compound (B)).

Compound (E): A compound having two (meth)acryloyloxy groups (excluding the compounds (A) and (B)).

Compound (F): A compound having at least three (meth acryloyloxy groups (excluding the compound (B)).

The viscosity of the photocurable composition of the present invention at 25° C. is preferably from 0.1 to 300 mPa·s, particularly preferably from 1 to 200 mPa·s. When the viscosity of the photocurable composition is within this range, the photocurable composition and the surface with a reverse pattern of a mold can easily be contacted without any special operation (for example, an operation of heating the photocurable composition to high temperature to make it have a low viscosity).

The photocurable composition of the present invention preferably contains substantially no solvent. When the photocurable composition contains substantially no solvent, curing of the photocurable composition can easily be carried out without any special operation excluding irradiation with light (for example, an operation of heating the photocurable composition to high temperature to remove the solvent).

The solvent is a compound other than the compounds (A) to (C), the photopolymerization initiator (D), the compound (E), the compound (F), the fluorinated surfactant (G), the fluoropolymer (H) and other additives and is a compound capable of dissolving any of the compounds (A) to (C), the photopolymerization initiator (D), the compound (E), the compound (F), the fluorinated surfactant (G), the fluoropolymer (H) and other additives.

Containing substantially no solvent means a case where no solvent is contained at all, or a case where a solvent only in an amount of preferably at most 1 mass %, particularly at most 0.7 mass % is contained in the photocurable composition (100 mass %). Particularly in the present invention, the solvent used in preparation of the photocurable composition may be contained as the remaining solvent, but even in such a case, the remaining solvent is preferably removed as far as possible, and its amount is preferably at most 1 mass % in the photocurable composition (100 mass %).

(Compound (A))

The aromatic compound having at least two rings is a compound having at least two benzene rings, and the at least two benzene rings may form a condensed ring (e.g. a naphthalene ring or an anthracene ring). The aromatic compound may, for example, be a compound having a bisphenol skeleton, a compound having a naphthalene skeleton or a compound having a fluorene skeleton.

The alicyclic compound having at least two rings is a compound having at least two hydrocarbon rings with no aromaticity, and may be a polycyclic compound having a bridge formed in one ring. Such a polycyclic compound may, for example, be a compound having a tricyclodecane skeleton containing an adamantane skeleton, a compound having a decalin skeleton, a compound having a norbornene skeleton or a compound having an isobornyl skeleton.

As the compound (A), the following compounds may be mentioned.

Bisphenol (A) di(meth)acrylate, modified bisphenol (A) di(meth)acrylate (e.g. ethoxylated bisphenol (A) di(meth) acrylate, propoxylated bisphenol A di(meth)acrylate, propoxylated ethoxylated bisphenol (A) di(meth)acrylate, bisphenol A glycerolate di(meth)acrylate or bisphenol (A) propoxylate glycerolate di(meth)acrylate), ethoxylated bisphenol F di(meth)acrylate, tricyclodecanedimethanol di(meth)acrylate, fluorene di(meth)acrylate, etc.

As the compound (A), in view of compatibility, particularly preferred is tricyclodecanedimethanol di(meth)acrylate, modified bisphenol A di(meth)acrylate (e.g. ethoxylated bisphenol A di(meth)acrylate, propoxylated bisphenol A di(meth)acrylate, propoxylated ethoxylated bisphenol A di(meth)acrylate, bisphenol A glycerolate di(meth)acrylate or bisphenol A propoxylate glycerolate di(meth)acrylate) or ethoxylated bisphenol F di(meth)acrylate.

The compounds (A) may be used alone or in combination of two or more.

The content of the compound (A) is from 15 to 60 mass %, preferably from 20 to 45 mass % based on the total amount (100 mass %) of the compound (A), the compound (B), the compound (C) and the photopolymerization initiator (D). When the content of the compound (A) is at least 15 mass %, a cured product excellent in mechanical strength will be obtained. When the content of the compound (A) is at most 60 mass %, a cured product will not be fragile.

(Compound (B))

The compound (B) may, for example, be a fluoro(meth) acrylate, a fluorodiene, a fluorovinyl ether or a fluorocyclic monomer, and in view of compatibility, preferred is a fluoro (meth)acrylate or a fluorodiene.

As the fluoro(meth)acrylate, the following compounds may be mentioned.

3-(Perfluoro-3-methylbutyl)-2-hydroxypropyl(meth)acrylate, 2,2,2-trifluoro-1-(trifluoromethyl)ethyl(meth)acrylate, $CH_2$=$CHCOO(CH_2)_2(CF_2)_{10}F$,
$CH_2$=$CHCOO(CH_2)_2(CF_2)_8F$,
$CH_2$=$CHCOO(CH_2)_2(CF_2)_6F$,
$CH_2$=$C(CH_3)COO(CH_2)_2(CF_2)_{10}F$,
$CH_2$=$C(CH_3)COO(CH_2)_2(CF_2)_8F$,
$CH_2$=$C(CH_3)COO(CH_2)_2(CF_2)_6F$,
$CH_2$=$CHCOOCH_2(CF_2)_6F$,
$CH_2$=$C(CH_3)COOCH_2(CF_2)_6F$,
$CH_2$=$CHCOOCH_2(CF_2)_7F$,
$CH_2$=$C(CH_3)COOCH_2(CF_2)_7F$,
$CH_2$=$CHCOOCH_2CF_2CF_2H$,
$CH_2$=$CHCOOCH_2(CF_2CF_2)_2H$,
$CH_2$=$CHCOOCH_2(CF_2CF_2)_4H$,
$CH_2$=$C(CH_3)COOCH_2(CF_2CF_2)H$,
$CH_2$=$C(CH_3)COOCH_2(CF_2CF_2)_2H$,
$CH_2$=$C(CH_3)COOCH_2(CF_2CF_2)_4H$,
$CH_2$=$CHCOOCH_2CF_2OCF_2CF_2OCF_3$,
$CH_2$=$CHCOOCH_2CF_2O(CF_2CF_2O)_3CF_3$,
$CH_2$=$C(CH_3)COOCH_2CF_2OCF_2CF_2OCF_3$,
$CH_2$=$C(CH_3)COOCH_2CF_2O(CF_2CF_2O)_3CF_3$,
$CH_2$=$CHCOOCH_2CF(CF_3)OCF_2CF(CF_3)O(CF_2)_3F$,
$CH_2$=$CHCOOCH_2CF(CF_3)O(CF_2CF(CF_3)O)_2(CF_2)_3F$,
$CH_2$=$C(CH_3)COOCH_2CF(CF_3)OCF_2CF(CF_3)O(CF_2)_3F$,
$CH_2$=$C(CH_3)COOCH_2CF(CF_3)O(CF_2CF(CF_3)O)_2(CF_2)_3F$,
$CH_2$=$CFCOOCH_2CH(OH)CH_2(CF_2)_6CF(CF_3)_2$,
$CH_2$=$CFCOOCH_2CH(CH_2OH)CH_2(CF_2)_6CF(CF_3)_2$,
$CH_2$=$CFCOOCH_2CH(OH)CH_2(CF_2)_{10}F$,
$CH_2$=$CFCOOCH_2CH(CH_2OH)CH_2(CF_2)_{10}F$,
$CH_2$=$CHCOOCH_2CF_2(OCF_2CF_2)_nOCF_2CH_2OCOCH$=$CH_2$ (where n is an integer of from 4 to 20), etc.

As the fluoro(meth)acrylate, in view of compatibility and environmental characteristics, preferred is a compound (B1):

(B1)

wherein $R^1$ is a hydrogen atom or a methyl group, each of $R^2$ and $R^3$ is a hydrogen atom or a $C_{1-4}$ alkyl group, each of $R^4$ and $R^5$ is a fluorine atom, a $C_{1-4}$ perfluoroalkyl group or a $C_{1-4}$ perfluoroalkoxy group, $R^6$ is a hydrogen atom or a fluorine atom, m is an integer of from 1 to 4, and n is an integer of from 1 to 16. n is preferably an integer of from 1 to 10 in view of compatibility, more preferably an integer of from 3 to 6 in view of environmental characteristics.

As the fluorodiene, the following compounds may be mentioned.

$CF_2$=$CFOCF_2CF$=$CF_2$,
$CF_2$=$CFOCF_2CF_2CF$=$CF_2$,
$CF_2$=$CFCF_2CF$=$CF_2$,
$CF_2$=$CFCF_2CH$=$CH_2$,
$CF_2$=$CFCF_2C(CF_3)(OH)CH_2CH$=$CH_2$,
$CF_2$=$CFCF_2C(CF_3)(OH)CH$=$CH_2$,
$CF_2$=$CFCH_2CH(CH_2C(CF_3)_2OH)CH_2CH$=$CH_2$, etc.

As the fluorovinyl ether, the following compounds may be mentioned.

$CF_2$=$CFO(CF_2)_3F$,
$CF_2$=$CFO(CF_2)_3COOCH_3$, etc.

As the fluorocyclic monomer, the following compounds may be mentioned.

The compounds (B) may be used alone or in combination of two or more.

The content of the compound (B) is from 5 to 40 mass %, preferably from 15 to 35 mass % based on the total amount (100 mass %) of the compound (A), the compound (B), the compound (C) and the photopolymerization initiator (D). When the content of the compound (B) is at least 5 mass %, a cured product excellent in mold release characteristics will be obtained, and foaming of the photocurable composition will be suppressed. When the foaming of the photocurable composition can be suppressed, filtration will easily be carried out at the time of preparation, and defects of the pattern shape due to inclusion of bubbles can be eliminated at the time of nanoimprinting. When the content of the compound (B) is at most 40 mass %, uniform mixing will be carried out, whereby a cured product excellent in mechanical strength will be obtained.

(Compound (C))

The compound (C) is a component to dissolve other components and is a component which improves compatibility between the compound (A) and the compound (B). When the compound (A) and the compound (B) are highly compatible with each other, preparation of the photocurable composition will be easy since foaming at the time of preparation of the photocurable composition will be suppressed, whereby filtration through a filter will easily be carried out, and further, a uniform photocurable composition will be obtained. Further, a homogeneous cured product will be obtained, whereby sufficient mold release characteristics and mechanical strength will be obtained.

The viscosity of the compound (C) at 25° C. is preferably from 0.1 to 200 mPa·s. When the viscosity of the compound (C) is within this range, the viscosity of the photocurable composition will easily be adjusted to be low.

As the compound (C), the following compounds may be mentioned.

Phenoxyethyl(meth)acrylate, 2-hydroxy-3-phenoxypropyl(meth)acrylate, phenoxyethylene glycol(meth)acrylate, phenoxydiethylene glycol(meth)acrylate, benzyl(meth)acrylate, methoxytriethylene glycol(meth)acrylate, methoxypolyethylene glycol(meth)acrylate, 2-(meth)acryloyloxyethylhexahydrophthalic acid, behenyl(meth)acrylate, 2-(meth)acryloyloxyethylsuccinic acid, stearyl(meth)acrylate, isostearyl(meth)acrylate, lauryl(meth)acrylate, 2-ethylhexyl(meth)acrylate, 3-(trimethoxysilyl)propyl(meth)acrylate, butyl(meth)acrylate, ethoxyethyl(meth)acrylate, methoxyethyl(meth)acrylate, glycidyl(meth)acrylate, tetrahydrofurfuryl(meth)acrylate, allyl(meth)acrylate, 2-hydroxyethyl(meth)acrylate, 2-hydroxypropyl(meth)acrylate, N,N-diethylaminoethyl(meth)acrylate, N,N-dimethylaminoethyl(meth)acrylate, dimethylaminoethyl(meth)acrylate, 2-methyl-2-adamantyl(meth)acrylate, 2-ethyl-2-adamantyl(meth)acrylate, 3-hydroxy-1-adamantyl(meth)acrylate, 1-adamantyl(meth)acrylate, isobornyl(meth)acrylate, β-carboxyethyl(meth)acrylate, octyl(meth)acrylate, decyl(meth)acrylate, 2-(tert-butylamino)ethyl(meth)acrylate, 1,2,2,6,6-pentamethyl-4-piperidyl(meth)acrylate, n-butyl(meth)acrylate, tert-butyl(meth)acrylate, 4-tert-butylcyclohexyl(meth)acrylate, etc.

The compounds (C) may be used alone or in combination of two or more.

The content of the compound (C) is from 10 to 55 mass %, preferably from 15 to 45 mass % based on the total amount (100 mass %) of the compound (A), the compound (B), the compound (C) and the photopolymerization initiator (D). When the content of the compound (C) is at least 10 mass %, the viscosity of the photocurable composition can be adjusted to be low, and the compound (A) and the compound (B) will be highly compatible. When the content of the compound (C) is at most 55 mass %, the sensitivity will be favorable, and the crosslinking density will increase, whereby a cured product excellent in mechanical strength will be obtained.

(Photopolymerization Initiator (D))

The photopolymerization initiator (D) may, for example, be an acetophenone photopolymerization initiator, a benzoin photopolymerization initiator, a benzophenone photopolymerization initiator, a thioxantone photopolymerization initiator, an α-aminoketone photopolymerization initiator, an α-hydroxyketone photopolymerization initiator, an α-acyloxime ester, benzyl-(o-ethoxycarbonyl)-α-monooxime, acylphosphine oxide, glyoxyester, 3-ketocoumarin, 2-ethylanthraquinone, camphorquinone, tetramethylthiuram sulfide, azobisisobutyronitrile, benzoyl peroxide, dialkyl peroxide or tert-butyl peroxypivalate, and in view of sensitivity and compatibility, preferred is an acetophenone photopolymerization initiator, a benzoin photopolymerization initiator, an α-aminoketone photopolymerization initiator or a benzophenone photopolymerization initiator.

As the acetophenone photopolymerization initiator, the following compounds may be mentioned.

Acetophenone, p-(tert-butyl)1',1',1'-trichloroacetophenone, chloroacetophenone, 2',2'-diethoxyacetophenone, hydroxyacetophenone, 2,2-dimethoxy-2'-phenylacetophenone, 2-aminoacetophenone, dialkylaminoacetophenone, etc.

As the benzoin photopolymerization initiator, the following compounds may be mentioned.

Benzyl, benzoin, benzoin methyl ether, benzoin ethyl ether, benzoin isopropyl ether, benzoin isobutyl ether, 1-hydroxycyclohexyl phenyl ketone, 2-hydroxy-2-methyl-1-phenyl-2-methylpropan-1-one, 1-(4-isopropylphenyl)-2-hydroxy-2-methylpropan-1-one, benzyl dimethyl ketal, etc.

As the α-aminoketone photopolymerization initiator, the following compounds may be mentioned.

2-Benzyl-2-dimethylamino-1-(4-morpholinophenyl)-butanone-1,2-methyl-1[4-(methylthio)phenyl]-2-morpholinopropan-1-one, etc.

As the benzophenone photopolymerization initiator, the following compounds may be mentioned.

Benzophenone, benzoylbenzoic acid, methyl benzoylbenzoate, methyl-o-benzoylbenzoate, 4-phenylbenzophenone, hydroxybenzophenone, hydroxypropylbenzophenone, acrylbenzophenone, 4,4'-bis(dimethylamino)benzophenone, etc.

The photopolymerization initiators (D) may be used alone or in combination of two or more.

The content of the photopolymerization initiator (D) is from 1 to 12 mass %, preferably from 4 to 10 mass % based on the total amount (100 mass %) of the compound (A), the compound (B), the compound (C) and the photopolymerization initiator (D). When the content of the photopolymerization initiator (D) is at least 1 mass %, a cured product will easily be obtained without an operation such as heating. When the content of the photopolymerization initiator (D) is at most 12 mass %, uniform mixing is possible, whereby the amount of the photopolymerization initiator (D) remaining in a cured product will be small, and accordingly a decrease in physical properties of the cured product will be suppressed.

(Compound (E))

The compound (E) is a component to dissolve other components and to improve mechanical strength of a cured product. When the compound (E) is a glycol compound, flexibility of the cured product will improve in addition.

As the compound (E), the following compounds may be mentioned.

Ethylene glycol di(meth)acrylate, dipropylene glycol di(meth)acrylate, 1,3-butanediol di(meth)acrylate, 1,4-butanediol di(meth)acrylate, glycerol 1,3-diglycerolate di(meth)acrylate, 1,6-hexanediol ethoxylate di(meth)acrylate, 1,6-hexanediol propoxylate di(meth) acrylate, 1,6-hexanediol di(meth)acrylate, 3-hydroxy-2,2-dimethylpropionate di(meth)acrylate, 1,9-nonanediol di(meth)acrylate, 1,10-decanediol di(meth)acrylate, diethylene glycol di(meth)acrylate, neopentyl glycol di(meth)acrylate, neopentyl glycol propoxylate di(meth)acrylate, polyethylene glycol di(meth)acrylate, propylene glycol di(meth)acrylate, glycerol di(meth)acrylate, propylene glycol glycerolate di(meth)acrylate, polypropylene glycol di(meth)acrylate, polyoxyethylene glycol di(meth)acrylate, tripropylene glycol di(meth)acrylate, triethylene glycol di(meth)acrylate, tetraethylene glycol di(meth)acrylate, tripropylene glycol glycerolate di(meth)acrylate, 2-hydroxy-3-acryloyloxypropyl(meth)acrylate, 2-methyl-1,3-propanediol diacrylate, trimethylolpropanebenzoate di(meth)acrylate, pentaerythritol di(meth)acrylate monostearate, trimethylolpropane ethoxylate methyl ether di(meth)acrylate, diurethane di(meth)acrylate, 1,3-bis(3-methacryloyloxypropyl)-1,1,3,3-tetramethyldicyloxane, etc.

The compounds (E) may be used alone or in combination of two or more.

The content of the compound (E) is preferably from 5 to 30 parts by mass, more preferably from 10 to 25 parts by mass per 100 parts by mass of the total amount of the compound (A), the compound (B), the compound (C) and the photopolymerization initiator (D). When the content of the compound (E) is at least 5 parts by mass, sensitivity of the photocurable composition will improve. When the content of the compound (E) is at most 30 parts by mass, compatibility of the respective components will be favorable.

(Compound (F))

The compound (F) is a component to improve mechanical strength (hardness) of a cured product.

As the compound (F), the following compounds may be mentioned.

Tri(meth)acrylate: trimethylolpropane tri(meth)acrylate, trimethylolpropane ethoxy tri(meth)acrylate, polyether tri(meth)acrylate, glycerol propoxy tri(meth)acrylate, pentaerythritol tri(meth)acrylate, ethoxylated isocyanurate triacrylate, ethoxylated trimethylolpropane triacrylate, propoxylated trimethylolpropane triacrylate, etc.

Tetra(meth)acrylate: pentaerythritol tetra(meth)acrylate, pentaerythritolethoxy tetra(meth)acrylate, ditrimethylolpropane tetra(meth)acrylate, propoxylated pentaerythritol tetraacrylate, etc.

Dipentaerythritol hexa(meth)acrylate, aromatic urethane tri(meth)acrylate, aromatic urethane tetra(meth)acrylate, aromatic urethane hexa(meth)acrylate, etc.

The compounds (F) may be used alone or in combination of two or more.

The content of the compound (F) is preferably from 5 to 90 parts by mass, more preferably from 10 to 80 parts by mass per 100 parts by mass of the total amount of the compound (A), the compound (B), the compound (C) and the photopolymerization initiator (D). When the content of the compound (F) is at least 5 parts by mass, mechanical strength of a cured product will improve. When the content of the compound (F) is at most 90 parts by mass, the viscosity of the photocurable composition can be suppressed low.

The total amount of the compound (E) and the compound (F) is preferably from 5 to 110 parts by mass, more preferably from 10 to 65 parts by mass per 100 parts by mass of the total amount of the compound (A), the compound (B), the compound (C) and the photopolymerization initiator (D).

(Fluorinated Surfactant (G))

The fluorinated surfactant (G) is a component to improve mold release characteristics of a cured product.

The fluorinated surfactant (G) is preferably a fluorinated surfactant having a fluorine content of from 10 to 70 mass %, more preferably a fluorinated surfactant having a fluorine content of from 10 to 40 mass %. The fluorinated surfactant may be water soluble or oil soluble.

The fluorinated surfactant (G) is preferably an anionic fluorinated surfactant, a cationic fluorinated surfactant, an amphoteric fluorinated surfactant or a nonionic fluorinated surfactant, more preferably a nonionic fluorinated surfactant in view of compatibility in the photocurable composition and dispersibility in the cured product.

The anionic fluorinated surfactant is preferably a polyfluoroalkyl carboxylate, a polyfluoroalkyl phosphate or a polyfluoroalkyl sulfonate.

Specific examples of the anionic fluorinated surfactant include Surflon S-111 (tradename, manufactured by Seimi Chemical Co., Ltd.), Fluorad FC-143 (tradename, manufactured by Sumitomo 3M Limited) and MEGAFACE F-120 (tradename, manufactured by DAINIPPON INK AND CHEMICALS, INCORPORATED).

The cationic fluorinated surfactant is preferably a trimethylammonium salt of a polyfluoroalkyl carboxylate or a trimethylammonium salt of a polyfluoroalkyl sulfonamide.

Specific examples of the cationic fluorinated surfactant include Surflon S-121 (tradename, manufactured by Seimi Chemical Co., Ltd.), Fluorad FX-134 (tradename, manufactured by Sumitomo 3M Limited) and MEGAFACE F-150 (tradename, manufactured by DAINIPPON INK AND CHEMICALS, INCORPORATED).

The amphoteric fluorinated surfactant is preferably polyfluoroalkylbetain.

Specific examples of the amphoteric fluorinated surfactant include Surflon S-132 (tradename, manufactured by Seimi Chemical Co., Ltd.), Fluorad FX-172 (tradename, manufactured by Sumitomo 3M Limited) and MEGAFACE F-120 (tradename, manufactured by DAINIPPON INK AND CHEMICALS, INCORPORATED).

The nonionic fluorinated surfactant is preferably a polyfluoroalkylamine oxide or a polyfluoroalkyl/alkylene oxide addition product.

Specific examples of the nonionic fluorinated surfactant include Surflon S-145 (tradename, manufactured by Seimi Chemical Co., Ltd.), Surflon S-393 (tradename, manufactured by Seimi Chemical Co., Ltd.), Surflon KH-20 (tradename, manufactured by Seimi Chemical Co., Ltd.), Surflon KH-40 (tradename, manufactured by Seimi Chemical Co., Ltd.), Fluorad FX-170 (tradename, manufactured by Sumitomo 3M Limited), Fluorad FC-430 (tradename, manufactured by Sumitomo 3M Limited) and MEGAFACE F-141 (tradename, manufactured by DAINIPPON INK AND CHEMICALS, INCORPORATED).

The fluorinated surfactants (G) may be used alone or in combination of two or more.

The content of the fluorinated surfactant (G) is preferably from 0.1 to 3 parts by mass, more preferably from 0.5 to 1 part by mass per 100 parts by mass of the total amount of the compound (A), the compound (B), the compound (C) and the photopolymerization initiator (D). When the content of the fluorinated surfactant (G) is at least 0.1 part by mass, mold release characteristics will improve. When the content of the fluorinated surfactant (G) is at most 3 parts by mass, inhibition of curing of the photocurable composition will be suppressed, and phase separation of a cured product will be suppressed.

The amount of the compound (B) is preferably from 0.5 to 100 times, particularly preferably from 10 to 75 times the total mass of the fluorinated surfactant (G). When the amount of the compound (B) is within this range, mold release characteristics by the compound (B) and the fluorinated surfactant (G) can synergistically be obtained. If the amount of the compound (B) is less than 0.5 times, the components will not be uniformly compatible, thus causing foaming. If the amount of the compound (B) exceeds 100 times, the effect of mold release characteristics by the fluorinated surfactant (G) will not be obtained.
(Fluoropolymer (H))

The fluoropolymer (H) is a component to adjust the viscosity of the photocurable composition.

The mass average molecular weight of the fluoropolymer (H) is preferably from 500 to 2,000,000, more preferably from 1,000 to 1,000,000 particularly preferably from 3,000 to 500,000. When the mass average molecular weight of the fluoropolymer (H) is within this range compatibility with other components will be favorable.

The fluorine content of the fluoropolymer (H) is preferably from 30 to 70 mass %, more preferably from 45 to 70 mass %. When the fluorine content of the fluoropolymer (H) is within this range, it will be uniformly dissolved in the photocurable composition, whereby the viscosity of the photocurable composition will easily be adjusted.

The fluoropolymer (H) is preferably a fluoropolymer having a hetero atom, more preferably a fluoropolymer having a nitrogen atom, an oxygen atom, a sulfur atom or a phosphorus atom, furthermore preferably a fluoropolymer having a hydroxyl group, an etheric oxygen atom, an ester group, an alkoxycarbonyl group, a sulfonyl group, a phosphate group, an amino group, a nitro group or a ketone group, and in view of compatibility, particularly preferably a fluoropolymer having a hydroxyl group, an etheric oxygen atom, an ester group or an alkoxycarbonyl group. The fluoropolymer having a hetero atom has high compatibility with other components, whereby a uniform photocurable composition will easily be prepared.

As the fluoropolymer (H), the following fluoropolymers (H1) to (H4) may be mentioned, and the fluoropolymer (H4) is preferred in view of compatibility.

Fluoropolymer (H1): A fluoropolymer obtained by polymerizing a compound (h1):

$$CF_2=CR^{11}\text{-}Q\text{-}CF^{12}=CH_2 \quad (h1)$$

wherein each of $R^{11}$ and $R^{12}$ is a hydrogen atom, a fluorine atom, a $C_{1-3}$ alkyl group or a $C_{1-3}$ fluoroalkyl group, Q is an oxygen atom, $-NR^{13}-$ or a bivalent organic group which may have a functional group, and $R^{13}$ is a hydrogen atom, a $C_{1-6}$ alkyl group, an alkylcarbonyl group or a tosyl group.

Fluoropolymer (H2): A fluoropolymer having fluoroolefin units and hydrocarbon monomer units.

As the fluoroolefin units, vinyl fluoride, vinylidene fluoride, trifluoroethylene, tetrafluoroethylene, pentafluoropropylene or hexafluoropropylene may, for example, be mentioned. As the hydrocarbon monomer units, a vinyl ether, a vinyl ester, an allyl ether, a hydrocarbon olefin, an acrylate or a methacrylate may, for example, be mentioned.

Fluoropolymer (H3): A fluoropolymer having fluoroethylene units and fluoro(meth)acrylate units.

As the fluoroethylene units, tetrafluoroethylene or $CF_2=CFCl$ may, for example, be mentioned. As the fluoro (meth)acrylate units, 2-(perfluorohexyl)ethyl methacrylate, 2-(perfluorohexyl)ethyl acrylate, 2-(perfluorooctyl)ethyl methacrylate or 2-(perfluorooctyl)ethyl acrylate may, for example, be mentioned.

Fluoropolymer (H4): A fluoropolymer having fluoroethylene units and compound (h4) units:

$$CHR^{17}=CH-O-R^{18} \quad (h4)$$

wherein $R^{17}$ is a hydrogen atom, a $C_{1-4}$ alkyl group, a phenyl group or a benzyl group, $R^{18}$ is a $C_{1-18}$ alkyl group, an alkyl group or phenyl group having at most 10 carbon atoms containing an aromatic ring, an alkyl group or phenyl group having at most 10 carbon atoms containing a hydroxyl group, an alkyl group or phenyl group having at most 10 carbon atoms containing a fluorine atom, or an alkyl group or phenyl group having at most 10 carbon atoms containing a carboxylic acid or an ester group.

The fluoropolymers (H) may be used alone or in combination of two or more.

The content of the fluoropolymer (H) is preferably from 5 to 25 parts by mass, more preferably from 7 to 20 parts by mass per 100 parts by mass of the total amount of the compound (A), the compound (B), the compound (C) and the photopolymerization initiator (D). When the content of the fluoropolymer (H) is at least 5 parts by mass, an effect of adjusting the viscosity of the photocurable composition will be obtained. When the content of the fluoropolymer (H) is at most 25 parts by mass, inhibition of curing of the photocurable composition will be suppressed, and phase separation of the cared product will be suppressed.

The amount of the compound (B) based on the total mass of the fluoropolymer (H) is preferably from 0.5 to 100 times, particularly preferably from 2 to 50 times. When the amount of the compound (B) is within this range, a uniform photocurable composition will be obtained without phase separation. If the amount of the compound (B) is less than 0.5 times, no effect of mold release characteristics will be obtained. If the amount of the compound (B) exceeds 100 times, phase separation will occur.

The total amount of the fluorinated surfactant (G) and the fluoropolymer (H) is preferably from 0.1 to 35 parts by mass, more preferably from 0.5 to 25 parts by mass per 100 parts by mass of the total amount of the compound (A), the compound (B), the compound (C) and the photopolymerization initiator (D).

The total amount of the compound (E), the compound (F), the fluorinated surfactant (G) and the fluoropolymer (H) is preferably from 0.1 to 125 parts by mass, more preferably from 0.5 to 85 parts by mass per 100 parts by mass of the total amount of the compound (A), the compound (B), the compound (C) and the photopolymerization initiator (D).
(Other Additives)

The photocurable composition may contain other additives excluding the compounds (A) to (C), the photopolymerization initiator (D), the compound (E), the compound (F), the fluorinated surfactant (G) and the fluoropolymer (H).

As other additives, a photosensitizer, another resin, fine metal oxide particles, a carbon compound, fine metal particles or another organic compound may, for example, be mentioned.

The photosensitizer may, for example, be an amine compound such as n-butylamine, di-n-butylamine, tri-n-butylphosphine, allylthiourea, s-benzylisothiuronium-p-toluene sulfinate, triethylamine, diethylaminoethyl methacrylate, triethylenetetramine or 4,4'-bis(dialkylamino)benzophenone.

Another resin may, for example, be a polyester, a polyester oligomer, a polycarbonate or a poly(meth)acrylate.

The fine metal oxide particles may, for example, be titania or silica.

The carbon compound may, for example, be carbon nanotubes or fullerene.

The fine metal particles may, for example, be fine particles of copper or platinum.

Another organic compound may, for example, be porphyrin or metal-containing porphyrin.

The total amount of other additives is preferably at most 20 mass % in the photocurable composition (100 mass %). When the total amount of other additives is at most 20 mass %, the photocurable composition will be uniformly mixed, whereby a homogeneous photocurable composition will be obtained.

From the above-described photocurable composition of the present invention, which contains the compound (A), a cured product excellent in mechanical strength can be obtained. Further, since it contains the compound (B), a cured product excellent in mold release characteristics can be obtained. Further, since it contains the compound (C), compatibility between the compound (A) and the compound (B) is excellent and as a result, mold release characteristics and mechanical strength of the cured product will further improve.

(Method for Producing Molded Product with Fine Pattern on its Surface)

The method for producing a molded product with a fine pattern on its surface of the present invention comprises the following steps (1) to (3).

(1) A step of bringing the photocurable composition of the present invention into contact with the surface with a pattern reverse of a fine pattern of a mold having the reverse pattern formed on its surface.

(2) A step of irradiating the photocurable composition with light in a state where the photocurable composition is in contact with the surface of the mold to cure the photocurable composition thereby to obtain a cured product.

(3) A step of separating the mold from the cured product to obtain a molded product with a fine pattern on its surface.

As the method for producing a molded product with a fine pattern on its surface of the present invention, more specifically, the following methods (a) to (c) may be mentioned.

Method (a):

A method comprising the following steps (a-1) to (a-4).

Figure 1:
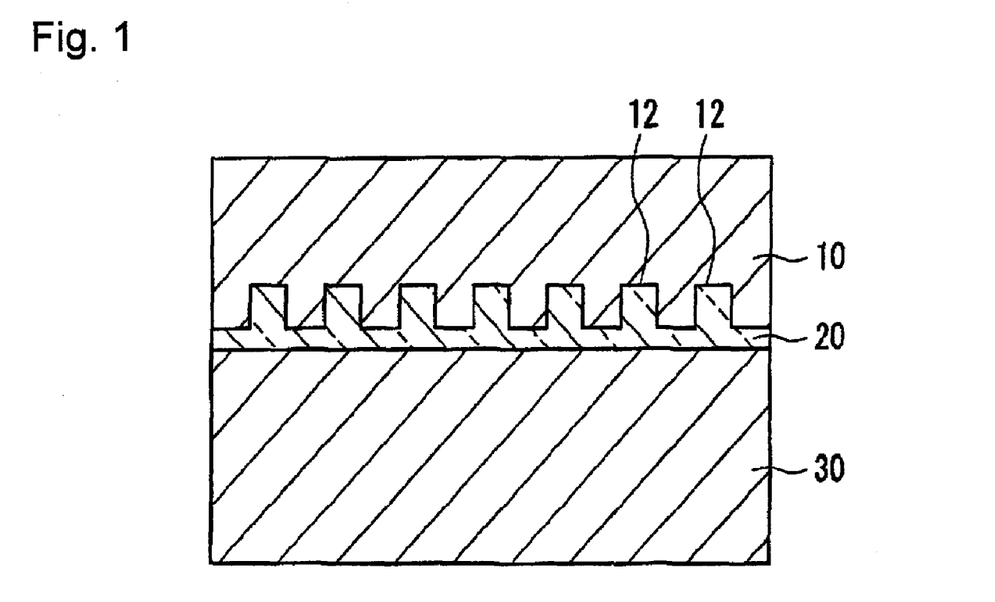
FIG. 1 is a cross section illustrating one example of the method for producing a molded product with a fine pattern on its surface.

(a-1) A step of disposing a photocurable composition 20 to the surface of a substrate 30 as shown in FIG. 1.

(a-2) A step of pressing a mold 10 on the photocurable composition 20 so that a reverse pattern 12 of the mold 10 is in contact with the photocurable composition 20 as shown in FIG. 1.

(a-3) A step of irradiating the photocurable composition 20 with light in a state where the mold 10 is pressed on the photocurable composition 20 to cure the photocurable composition 20 thereby to obtain a cured product.

(a-4) A step of separating the mold 10, or the substrate 30 and the mold 10, from the cured product to obtain a molded product with a fine pattern on its surface.

Method (b):

A method comprising the following steps (b-1) to (b-4).

Figure 2:
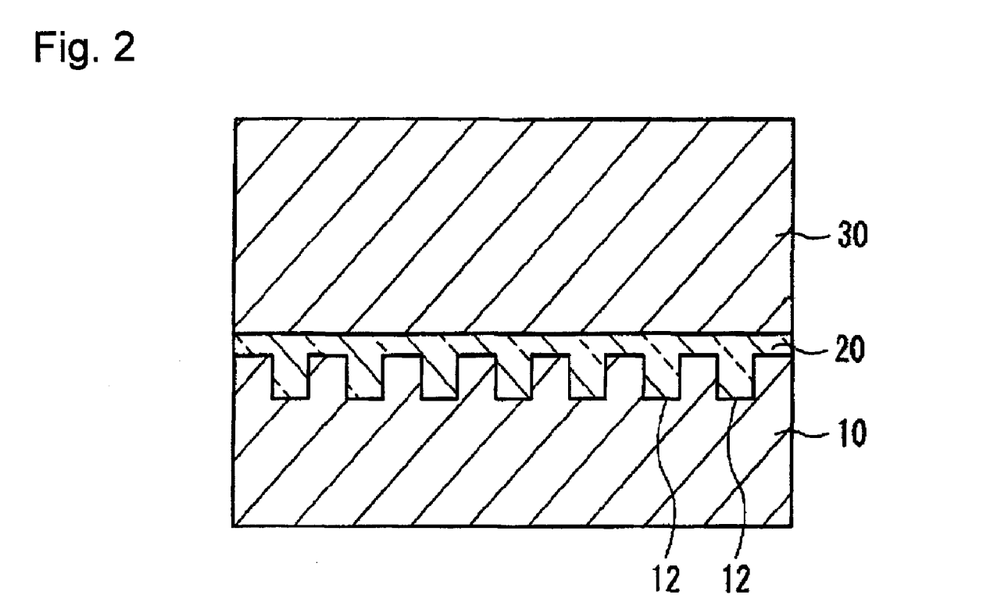
FIG. 2 is a cross section illustrating another example of a method for producing a molded product with a fine pattern on its surface.

(b-1) A step of disposing a photocurable composition 20 to the surface of a reverse pattern 12 of a mold 10 as shown in FIG. 2.

(b-2) A step of pressing a substrate 30 on the photocurable composition 20 on the surface of the mold 10 as shown in FIG. 2.

(b-3) A step of irradiating the photocurable composition 20 with light in a state where the substrate 30 is pressed on the photocurable composition 20 to cure the photocurable composition 20 thereby to obtain a cured product.

(b-4) A step of separating the mold 10, or the substrate 30 and the mold 10, from the cured product to obtain a molded product with a fine pattern on its surface.

Method (c):

A method comprising the following steps (c-1) to (c-4).

(c-1) A step of bringing a substrate 30 and a mold 10 into close to or into contact with each other so that a reverse pattern 12 of the mold 10 is on the substrate 30 side as shown in FIG. 1.

(c-2) A step of filling a photocurable composition 20 between the substrate 30 and the mold 10 as shown in FIG. 1.

(c-3) A step of irradiating the photocurable composition 20 with light in a state where the substrate 30 and mold 10 are close to or in contact with each other to cure the photocurable composition 20 thereby to obtain a cured product.

(c-4) A step of separating the mold 10, or the substrate 30 and the mold 10, from the cured product to obtain a molded product with a fine pattern on its surface.

The substrate may be a substrate made of an inorganic material or a substrate made of an organic material.

The inorganic material may, for example, be silicon wafer, glass, quartz glass, a metal (such as aluminum, nickel or copper), a metal oxide (such as alumina), silicon nitride, aluminum nitride or lithium niobate.

The organic material may, for example, be a fluororesin, a silicone resin, an acrylic resin, a polycarbonate, a polyester (such as polyethylene terephthalate), a polyimide, a polypropylene, a polyethylene, a nylon resin, a polyphenylene sulfide or a cyclic polyolefin.

As the substrate, a surface-treated substrate may be used, which is excellent in adhesion to the photocurable composition. The surface treatment may, for example, be primer coating treatment, ozone treatment or plasma etching treatment. The primer may, for example, be a silane coupling agent or a silazane.

The mold may be a mold made of a non-translucent material or a mold made of a translucent material.

The non-translucent material may, for example, be silicon wafer, nickel, copper, stainless steel, titanium, SiC or mica.

The translucent material may, for example, be quartz, glass, polydimethylsiloxane, a cyclic polyolefin, a polycarbonate, a polyethylene terephthalate or a transparent fluororesin.

At least one of the substrate and the mold is made of a material which is transparent to at least 40% of light having a wavelength at which the photopolymerization initiator (D) acts.

The mold has a reverse pattern on its surface. The reverse pattern is a reverse pattern corresponding to the fine pattern on the surface of the molded product.

The reverse pattern has a fine convex portion and/or a concave portion.

The convex portion may, for example, be a continuous convex extending on the surface of the mold or protrusions dotted on the surface.

The concave portion may, for example, be a continuous groove extending on the surface of the mold or pores dotted on the surface.

The shape of the convex or the groove may, for example, be a straight line, a curve or a bent line. A plurality of convexes or grooves may be present in parallel with each other to form stripes.

The cross-sectional shape of the convex or the groove in a direction at right angles to the longitudinal direction may, for example, be rectangular, trapezoidal, triangular or semi-circular.

The shape of the protrusions or the pores may be triangular prism, quadrangular prism, hexagonal column, cylindrical column, triangular pyramid, quadrangular pyramid, six-sided pyramid, circular cone, hemisphere or polyhedron.

The width of the convex or the groove is preferably from 1 nm to 100 μm on an average, more preferably from 10 nm to 10 μm. The width of the convex means the length of the base in the cross section in a direction at right angles to the longitudinal direction. The width of the groove means the length of the upper side in the cross section in a direction at right angles to the longitudinal direction.

The width of the protrusions or the pores is preferably from 1 nm to 100 µm on an average, more preferably from 10 nm to 10 µm. The width of the protrusions means, in a case where the bottom face is elongated, the length of the base in the cross section in a direction at right angles to the longitudinal direction, and in other cases, the maximum length at the bottom face of the protrusions. The width of the pores means, in a case where the opening is elongated, the length of the upper side in the cross section in a direction at right angles to the longitudinal direction, and in other cases, the maximum length at the opening of the protrusions.

The height of the convex portion is preferably from 1 nm to 100 µm on an average, more preferably from 10 nm to 10 µm.

The depth of the concave portion is preferably from 1 nm to 100 µm on an average, more preferably from 10 nm to 10 µm.

In a region where the reverse pattern is present at high density, the distance between adjacent convex portions (or concave portions) is preferably from 1 nm to 500 µm on an average, more preferably from 1 nm to 50 µm. The distance between adjacent convex portions means a distance from the terminal of the base of the cross section of a convex portion to the start point of the base of the cross section of the adjacent convex portion. The distance between adjacent concave portions means a distance between the terminal of the upper side of the cross section of a concave portion and the start point of the upper side of the cross section of the adjacent concave portion.

The minimum dimension of the convex portion is preferably from 1 nm to 50 µm, more preferably from 1 nm to 500 nm, particularly preferably from 1 nm to 50 nm. The minimum dimension means the minimum dimension among the width, the length and the height of the convex portion.

The minimum dimension of the concave portion is preferably from 1 nm to 50 µm, more preferably from 1 nm to 500 nm, particularly preferably from 1 nm to 50 nm. The minimum dimension means the minimum dimension among the width, the length and the depth of the concave portion.

Step (a-1):
The method of disposing the photocurable composition may, for example, be an ink jet method, a potting method, a spin coating method, a roll coating method, a casting method, a dip coating method, a die coating method, a Langmuir Blodgett method or a vacuum vapor deposition method.

The photocurable composition may be disposed on the entire surface of the substrate, or may be disposed on a part of the substrate.

Step (a-2):
The pressing pressure (gauge pressure) at the time of pressing the mold on the photocurable composition is preferably higher than 0 and at most 10 MPa, more preferably from 0.1 to 5 MPa. The temperature at the time of pressing the mold on the photocurable composition is preferably from 0 to 100° C., more preferably from 10 to 60° C.

Step (b-1):
The method of disposing the photocurable composition may, for example, be an ink jet method, a potting method, a spin coating method, a roll coating method, a casting method, a dip coating method, a die coating method, a Langmuir Blodgett method or a vacuum vapor deposition method.

The photocurable composition may be disposed on the entire surface of the reverse pattern of the mold or may be disposed on a part of the reverse pattern, and is preferably disposed on the entire surface of the reverser pattern.

Step (b-2):
The pressing pressure (gauge pressure) at the time of pressing the substrate on the photocurable composition is preferably higher than 0 and at most 10 MPa, more preferably from 0.1 to 5 MPa. The temperature at the time of pressing the substrate on the photocurable composition is preferably from 0 to 100° C., more preferably from 10 to 60° C.

Step (c-2):
As a method of filling the photocurable composition between the substrate and the mold, a method of sucking the photocurable composition in the gap by a capillary action may be mentioned.

The temperature at the time of filling the photocurable composition is preferably from 0 to 100° C., more preferably from 10 to 60° C.

Steps (a-3), (b-3) and (c-3):
The light irradiation method may be a light irradiation method using a mold made of a translucent material from the mold side, or a light irradiation method using a substrate made of a translucent material from the substrate side. The wavelength of light is preferably from 200 to 500 nm. At the time of light irradiation, the photocurable composition may be heated to accelerate curing.

The temperature at the time of light irradiation is preferably from 0 to 100° C., more preferably from 10 to 60° C.

Steps (a-4), (b-4) and (c-4):
The temperature at the time of separating the mold, or the substrate and the mold, from the cured product is preferably from 0 to 100° C., more preferably from 10 to 60° C.

Figure 3:
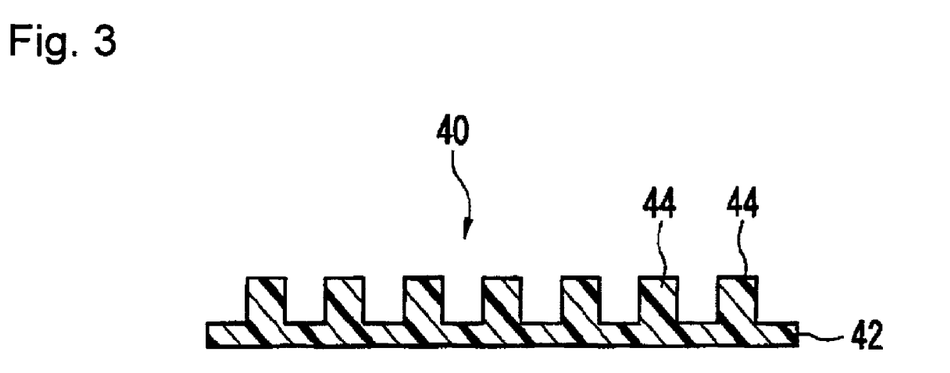
FIG. 3 is a cross section illustrating one example of a molded product with a fine pattern on its surface.

When the substrate and the mold are separated from the cured product, as shown in FIG. 3, a molded product 40 with a fine pattern 44 on its surface consisting only of a cured product 42 with a surface having the reverse pattern of the mold transferred, is obtained.

Figure 4:
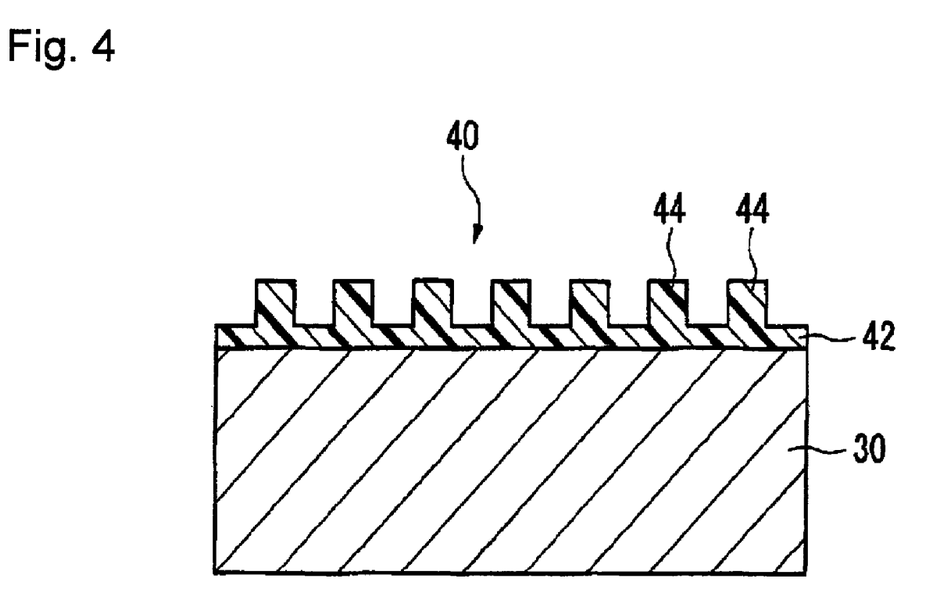
FIG. 4 is a cross section illustrating another example of a molded product with a fine pattern on its surface.

When only the mold is separated from the cured product, as shown in FIG. 4, a molded product 40 (laminate) with a fine pattern 44 on its surface, comprising a cured product 42 with a surface having the reverse pattern of the mold transferred and a substrate 30, is obtained.

As a molded product with a fine pattern on its surface, the following articles may be mentioned.

Optical elements: A microlens array, an optical waveguide element, an optical switching element (such as a grid polarizing element or a wave plate), a fresnel zone plate element, a binary optical element, a blaze optical element, a photonics crystal, etc.

Anti-reflection components: AR (anti reflection) coating member, etc.

Chips: Biochips, chips for µ-TAS (micro-total analysis systems), microreactor chips, etc.

Others: A recording medium, a display material, a carrier for a catalyst, a filter, a sensor component, a resist to be used for production of a semiconductor apparatus, a daughter mold for nanoimprinting, etc.

When it is used as a resist, a fine pattern can be formed on a substrate by etching the substrate using the molded product with a fine pattern as a mask.

In the above-described method for producing a molded product with a fine pattern on its surface of the present invention, since the photocurable composition of the present invention from which a cured product excellent in mold release characteristics and mechanical strength can be obtained is used, a molded product excellent in durability, with a fine pattern having a reverse pattern of a mold precisely transferred on its surface, can be produced.

EXAMPLES

Now, the present invention will be described in further detail with reference to Examples, but the present invention is by no means restricted to such specific Examples.

Examples 1 to 10 and 19 to 27 are Examples, and Examples 11 to 18 are Comparative Examples.

(Mass Average Molecular Weight)

The mass averse molecular weight of the fluoropolymer (H) was measured by using a GPC analyzer (manufactured by TOSOH CORPORATION, HLC-8220).

(Viscosity)

The viscosity of the photocurable composition at 25° C. was measured by using a viscometer (manufactured by Toki Sangyo) Co., Ltd.). The viscometer is one calibrated with a standard fluid (JS50 (33.17 mPa·S at 25° C.)). The viscosity was judged to be favorable when it was at most 300 mPa·S.

(Sensitivity)

The sensitivity of the photocurable composition was determined as follows.

The photocurable composition was formed into a film with a thickness of about 1.5 μm by a spin coating method, and the coating film was irradiated with light from a high pressure mercury lamp (a light source having dominant wavelengths at 255, 315 and 365 nm at from 1.5 to 2.0 kHz) to determine the accumulated quantity of light until complete curing, which was regarded as the sensitivity. Whether the photocurable composition was completely cured was judged by measuring an IR spectrum and from the presence or absence of absorption of an olefin at the acrylic moiety. The sensitivity was judged to be favorable with a value of at most 500 mJ/cm$^2$.

(Volume Shrinkage Ratio)

The volume shrinkage ratio was determined as follows.

The photocurable composition was sealed in a test tube (made of glass) to a height of L1 at 25° C., the photocurable composition was irradiated with light from a high pressure mercury lamp (a light source having dominant wavelengths at 255, 315 and 365 nm at from 1.5 to 2.0 kHz) for 15 seconds, and the height L2 of the obtained cured product was measured. The volume shrinkage ratio was determined from the following formula. The volume shrinkage ratio was judged to be favorable when it was at most 15%.

Volume shrinkage ratio(%)=(L1−L2)/L1×100

(Contact Angle)

The contact angle of the cured product against water was measured as follows.

The photocurable composition was irradiated with light from a high pressure mercury lamp (a light source having dominant wavelengths at 255, 315 and 365 nm at from 1.5 to 2.0 kHz) for 15 seconds to obtain a cured product.

With respect to the cured product, 4 μL of water was dropped on the surface of the cured product for measurement by using a contact angle meter (manufactured by Kyowa Interface Science Co., Ltd., model CA-X150).

The contact angle is a measure of mold release characteristics of the cured product. The contact angle was judged to be favorable when it was at least 75°.

(Pencil Hardness)

The pencil hardness of the cured product was measured as follows.

The photocurable composition was irradiated with light from a high pressure mercury lamp (a light source having dominant wavelengths at 255, 315 and 365 nm at from 1.5 to 2.0 kHz) for 15 seconds to obtain a cured product.

The pencil hardness of the cured product was determined in accordance with JIS K5400 (old JIS) under a load of 1 kg.

The pencil hardness is a measure of mechanical strength of the cured product. The pencil hardness was judged to be favorable when the result was F or higher.

(Dry Etching Resistance)

The dry etching resistance was determined as follows.

The photocurable composition was applied to a substrate (silicon wafer), and then the photocurable composition was irradiated with light from a high pressure mercury lamp (a light source having dominant wavelengths at 255, 315 and 365 nm at from 1.5 to 2.0 kHz) for 15 seconds to obtain a cured product. The substrate on which the cured product was formed and a substrate to which polymethyl methacrylate (hereinafter referred to as PMMA) was applied were prepared, and etching treatment was carried out simultaneously using RIE-10NR (manufactured by SAMCO) under conditions of $CF_4/O_2$ (40/10 sccm) under a pressure of 5 Pa at an output of 70 W for 120 seconds. The etching rate were calculated from differences in thickness as between before and after the etching treatment, and the relative etching rate of the cured product when the etching rate of PMMA was 1, was determined, which was regarded as the drying etching resistance. The dry etching resistance was judged to be favorable when the relative value was at most 0.6.

(Compound (A1))

(Compound (A2))

wherein each of q and r is an integer of from 1 to 3.

(Compound (A3))

(Compound B11))

-continued

(Compound B2))

$CF_2=CFCF_2C(CF_3)(OH)CH_2CH=CH_2$ (B2)

(Compound C1))

(C1)

(Compound C2))

(C2)

(Photopolymerization Initiator (D1))

Photopolymerization initiator (D1): Tradename: IRGACURE 651, manufactured by Ciba Geigy Specialty (Compound (E1))

(E1)

(Compound (F1))

(F1)

(Fluorinated Surfactant (G1))

Fluorinated surfactant (G1): Nonionic fluorinated surfactant, tradename: Surflon S-393, manufactured by Seimi Chemical Co., Ltd.

(Fluoropolymer (H11))

9.00 g of the compound (B2) and 38.37 g of 1,4-dioxane were charged in a pressure reactor (internal capacity: 50 mL, made of glass), and then 0.71 g of diisopropyl peroxydicarbonate was charged. The reactor was freeze deaerated, and then the internal temperature was maintained at 40° C., followed by polymerization for 18 hours. Then, the content in the reactor was dropped in hexane. The agglomerated solid content was recovered and vacuum dried at 110° C. for 40 hours to obtain 6.33 g of a white powdery amorphous fluoropolymer having the following repeating units (fluorine content: 56.3 mass %) (hereinafter referred to as a fluoropolymer (H11)). The fluoropolymer (H11) had a glass transition temperature of 118° C., a number average molecular weight of 2,600 and a mass average molecular weight of 4,800:

(Fluoropolymer (H41))

Fluoropolymer (H41): Tradename: LUMIFLON LF710, manufactured by Asahi Glass Company, Limited, mass average molecular weight: 40,000.

Example 1

In a vial (internal capacity: 6 mL), 1.52 g of the compound (A1), 0.88 g of the compound (B11) and 1.44 g of the compound (C1) were added, then 0.16 g of the photopolymerization initiator (D1) was mixed, and the mixture was subjected to filtration through a 0.2 μm filter made of polyethylene terephthalate (hereinafter referred to as PTFE) to obtain a photocurable composition. The composition of the photocurable composition is shown in Table 1, and the evaluation results are shown in Table 2.

Example 2

In a vial (internal capacity: 6 mL), 1.52 g of the compound (A2), 0.88 g of the compound (B11) and 1.44 g of the compound (C1) were added, then 0.16 g of the photopolymerization initiator (D1) was mixed, and the mixture was subjected to filtration through a 0.2 μm filter made of PTFE to obtain a photocurable composition. The composition of the photocurable composition is shown in Table 1, and the evaluation results are shown in Table 2.

Example 3

In a vial (internal capacity: 6 mL), 1.52 g of the compound (A3), 0.88 g of the compound (B11) and 1.44 g of the compound (C1) were added, then 0.16 g of the photopolymerization initiator (D1) was mixed, and the mixture was subjected to filtration through a 0.2 μm filter made of PTFE to obtain a photocurable composition. The composition of the photocurable composition is shown in Table 1, and the evaluation results are shown in Table 2.

Example 4

In a vial (internal capacity: 6 mL), 1.52 g of the compound (A2), 0.88 g of the compound (B2) and 1.44 g of the compound (C1) were added, then 0.16 g of the photopolymerization initiator (D1) was mixed, and the mixture was subjected to filtration through a 0.2 μm filter made of PTFE to obtain a photocurable composition. The composition of the photocurable composition is shown in Table 1, and the evaluation results are shown in Table 2.

Example 5

In a vial (internal capacity: 6 mL), 1.52 g of the compound (A2), 0.88 g of the compound (B11) and 1.44 g of the compound (C2) were added, then 0.16 g of the photopolymerization initiator (D1) was mixed, and the mixture was subjected to filtration through a 0.2 μm filter made of PTFE to obtain a photocurable composition. The composition of the photocurable composition is shown in Table 1, and the evaluation results are shown in Table 2.

Example 6

In a vial (internal capacity: 6 mL), 1.32 g of the compound (A2), 0.80 g of the compound (B11), 1.32 g of the compound (C1) and 0.40 g of the compound (E1) were added, then 0.16 g of the photopolymerization initiator (D1) was mixed, and the mixture was subjected to filtration through a 0.2 µm filter made of PTFE to obtain a photocurable composition. The composition of the photocurable composition is shown in Table 1, and the evaluation results are shown in Table 2.

Example 7

In a vial (internal capacity: 6 mL), 1.20 g of the compound (A2), 0.80 g of the compound (B11), 1.20 g of the compound (C1), 0.32 g of the compound (E1) and 0.32 g of the compound (F1) were added, then 0.16 g of the photopolymerization initiator (D1) was mixed, and the mixture was subjected to filtration through a 0.2 µm filter made of PTFE to obtain a photocurable composition. The composition of the photocurable composition is shown in Table 1, and the evaluation results are shown in Table 2.

Example 8

In a vial (internal capacity: 6 mL), 1.20 g of the compound (A2), 0.80 g of the compound (B11), 1.20 g of the compound (C1), 0.28 g of the compound (E1), 0.28 g of the compound (F1) and 0.08 g of the fluorinated surfactant (G1) were added, then 0.16 g of the photopolymerization initiator (D1) was mixed, and the mixture was subjected to filtration through a 0.2 µm filter made of PTFE to obtain a photocurable composition. The composition of the photocurable composition is shown in Table 1, and the evaluation results are shown in Table 2.

Example 9

In a vial (internal capacity: 6 mL), 1.20 g of the compound (A2), 0.80 g of the compound (B11), 1.20 g of the compound (C1), 0.28 g of the compound (E1), 0.08 g of the fluorinated surfactant (G1) and 0.28 g of the fluoropolymer (H11) were added, then 0.16 g of the photopolymerization initiator (D1) was mixed, and the mixture was subjected to filtration through a 0.2 µm filter made of PTFE to obtain a photocurable composition. The composition of the photocurable composition is shown in Table 1, and the evaluation results are shown in Table 2.

Example 10

In a vial (internal capacity: 6 mL), 1.20 g of the compound (A2), 0.80 g of the compound (B11), 1.20 g of the compound (C1), 0.28 g of the compound (E1), 0.08 g of the fluorinated surfactant (G1) and 0.28 g of the fluoropolymer (H41) were added, then 0.16 g of the photopolymerization initiator (D1) was mixed, and the mixture was subjected to filtration through a 0.2 µm filter made of PTFE to obtain a photocurable composition. The composition of the photocurable composition is shown in Table 1, and the evaluation results are shown in Table 2.

Example 11

In a vial (internal capacity: 6 mL), 0.28 g of the compound (A1), 1.56 g of the compound (B11) and 0.20 g of the compound (C1) were added, then 0.16 g of the photopolymerization initiator (D1) was mixed, and the mixture was subjected to filtration through a 0.2 µm filter made of PTFE to obtain a photocurable composition. The composition of the photocurable composition is shown in Table 1, and the evaluation results are shown in Table 2.

Example 12

In a vial (internal capacity: 6 mL), 3.00 g of the compound (A1), 0.40 g of the compound (B11) and 0.44 g of the compound (C1) were added, then 0.16 g of the photopolymerization initiator (D1) was mixed, and the mixture was subjected to filtration through a 0.2 µm filter made of PTFE to obtain a photocurable composition. However, the cured product was hard and fragile and was difficult to handle as a self-supporting membrane. The composition of the photocurable composition is shown in Table 1, and the evaluation results are shown in Table 2.

Example 13

In a vial (internal capacity: 6 mL), 1.84 g of the compound (A1), 0.12 g of the compound (B11) and 1.88 g of the compound (C1) were added, then 0.16 g of the photopolymerization initiator (D1) was mixed, and the mixture was subjected to filtration through a 0.2 µm filter made of PTFE to obtain a photocurable composition. The composition of the photocurable composition is shown in Table 1, and the evaluation results are shown in Table 2.

Example 14

In a vial (internal capacity: 6 mL), 0.80 g of the compound (A1), 2.20 g of the compound (B11) and 0.84 g of the compound (C1) were added, and then 0.16 g of the photopolymerization initiator (D1) was mixed, but they were not uniformly mixed, and phase separation occurred. The composition of the obtained composition is shown in Table 1.

Example 15

In a vial (internal capacity: 6 mL), 1.96 g of the compound (A1), 1.60 g of the compound (B11) and 0.28 g of the compound (C1) were added, and then 0.16 g of the photopolymerization initiator (D1) was mixed, but they were not uniformly mixed, and phase separation occurred. The composition of the obtained composition is shown in Table 1.

Example 16

In a vial (internal capacity: 6 mL), 0.60 g of the compound (A1), 0.24 g of the compound (B11) and 3.00 g of the compound (C1) were added, then 0.16 g of the photopolymerization initiator (D1) was mixed, and the mixture was subjected to filtration through a 0.2 µm filter made of PTFE to obtain a photocurable composition. However, the cured product was fragile and was difficult to handle as a self-supporting membrane. The composition of the photocurable composition is shown in Table 1, and the evaluation results are shown in Table 2.

Example 17

In a vial (internal capacity: 6 mL), 1.60 g of the compound (A1), 0.96 g of the compound (B11) and 1.42 g of the compound (C1) were added, then 0.02 g of the photopolymerization initiator (D1) was mixed, and the mixture was subjected to filtration through a 0.2 µm filter made of PTFE to obtain a photocurable composition. However, even after light irradiation, the amount of an uncured portion was large, and no cured product could be obtained. The composition of the obtained composition is shown in Table 1, and the evaluation results are shown in Table 2.

Example 18

In a vial (internal capacity: 6 mL), 1.20 g of the compound (A1), 0.72 g of the compound (B11) and 1.28 g of the compound (C1) were added, and then 0.80 g of the photopolymerization initiator (D1) was mixed, but the photopolymerization initiator (D1) was not completely dissolved, whereby no uniform composition could be obtained. The composition of the obtained composition is shown in Table 1.

Example 19

In a vial (internal capacity: 6 mL), 1.44 g of the compound (A1), 0.88 g of the compound (B11), 1.44 g of the compound (C1) and 0.08 g of the compound (E1) were added, then 0.16 g of the photopolymerization initiator (D1) was mixed, and the mixture was subjected to filtration through a 0.2 μm filter made of PTFE to obtain a photocurable composition. The composition of the photocurable composition is shown in Table 1, and the evaluation results are shown in Table 2.

Example 20

In a vial (internal capacity: 6 mL), 1.08 g of the compound (A1), 0.56 g of the compound (B11), 1.20 g of the compound (C1) and 1.00 g of the compound (E1) were added, then 0.16 g of the photopolymerization initiator (D1) was mixed, and the mixture was subjected to filtration through a 0.2 μm filter made of PTFE to obtain a photocurable composition. The composition of the photocurable composition is shown in Table 1, and the evaluation results are shown in Table 2.

Example 21

In a vial (internal capacity: 6 mL), 1.32 g of the compound (A2), 0.88 g of the compound (B11), 1.40 g of the compound (C1), 0.20 g of the compound (E1) and 0.04 g of Compound (F1) were added, then 0.16 g of the photopolymerization initiator (D1) was mixed, and the mixture was subjected to filtration through a 0.2 μm filter made of PTFE to obtain a photocurable composition. The composition of the photocurable composition is shown in Table 1, and the evaluation results are shown in Table 2.

Example 22

In a vial (internal capacity: 6 mL), 0.64 g of the compound (A2), 0.40 g of the compound (B11), 0.72 g of the compound (C1), 0.26 g of the compound (E1) and 1.82 g of the Compound (F1) were added, then 0.16 g of the photopolymerization initiator (D1) was mixed, and the mixture was subjected to filtration through a 0.2 μm filter made of PTFE to obtain a photocurable composition. The composition of the photocurable composition is shown in Table 1, and the evaluation results are shown in Table 2.

Example 23

In a vial (internal capacity: 6 mL), 1.20 g of the compound (A2), 0.20 g of the compound (B11), 1.24 g of the compound (C1), 0.80 g of the compound (E1), 0.40 g of the compound (F1) and 0.002 g of the fluorinated surfactant (G1) were added, then 0.16 g of the photopolymerization initiator (D1) was mixed, and the mixture was subjected to filtration through a 0.2 μm filter made of PTFE to obtain a photocurable composition. The composition of the photocurable composition is shown in Table 1, and the evaluation results are shown in Table 2.

Example 24

In a vial (internal capacity: 6 mL), 1.08 g of the compound (A2), 0.88 g of the compound (B11), 1.08 g of the compound (C1), 0.68 g of the compound (E1) and 0.12 g of the fluorinated surfactant (G1) were added, then 0.16 g of the photopolymerization initiator (D1) was mixed, and the mixture was subjected to filtration through a 0.2 μm filter made of PTFE to obtain a photocurable composition. The composition of the photocurable composition is shown in Table 1, and the evaluation results are shown in Table 2.

Example 25

In a vial (internal capacity: 6 mL), 1.28 g of the compound (A2), 0.80 g of the compound (B11), 1.28 g of the compound (C1), 0.280 g of the compound (E1), 0.08 g of the fluorinated surfactant (G1) and 0.12 g of the fluoropolymer (H11) were added, then 0.16 g of the photopolymerization initiator (D1) was mixed, and the mixture was subjected to filtration through a 0.2 μm filter made of PTFE to obtain a photocurable composition. The composition of the photocurable composition is shown in Table 1, and the evaluation results are shown in Table 2.

Example 26

In a vial (internal capacity: 6 mL), 0.96 g of the compound (A2), 0.68 g of the compound (B11), 1.00 g of the compound (C1), 0.20 g of the compound (E1), 0.08 g of the fluorinated surfactant (G1) and 0.84 g of the fluoropolymer (H11) were added, then 0.24 g of the photopolymerization initiator (D1) was mixed, and the mixture was subjected to filtration through a 0.2 μm filter made of PTFE to obtain a photocurable composition. The composition of the photocurable composition is shown in Table 1, and the evaluation results are shown in Table 2.

TABLE 1

| | Mass % based on 100 mass % of (A) + (B) + (C) + (D) | | | |
|---|---|---|---|---|
| | (A) | (B) | (C) | (D) |
| Example 1 | 38.0 | 22.0 | 36.0 | 4.0 |
| Example 2 | 38.0 | 22.0 | 36.0 | 4.0 |
| Example 3 | 38.0 | 22.0 | 36.0 | 4.0 |
| Example 4 | 38.0 | 22.0 | 36.0 | 4.0 |
| Example 5 | 38.0 | 22.0 | 36.0 | 4.0 |
| Example 6 | 36.7 | 22.2 | 36.7 | 4.4 |
| Example 7 | 35.7 | 23.8 | 35.7 | 4.8 |
| Example 8 | 35.7 | 23.8 | 35.7 | 4.8 |
| Example 9 | 35.7 | 23.8 | 35.7 | 4.8 |
| Example 10 | 35.7 | 23.8 | 35.7 | 4.8 |
| Example 11 | 7.0 | 39.0 | 50.0 | 4.0 |
| Example 12 | 65.0 | 16.0 | 15.0 | 4.0 |
| Example 13 | 45.9 | 3.0 | 47.1 | 4.0 |
| Example 14 | 20.0 | 55.0 | 21.0 | 4.0 |
| Example 15 | 49.0 | 40.0 | 7.0 | 4.0 |
| Example 16 | 15.0 | 6.0 | 75.0 | 4.0 |
| Example 17 | 40.0 | 24.0 | 35.5 | 0.5 |
| Example 18 | 35.0 | 18.0 | 32.0 | 15.0 |
| Example 19 | 36.7 | 22.4 | 36.7 | 4.1 |
| Example 20 | 36.0 | 18.7 | 40.0 | 5.3 |
| Example 21 | 35.1 | 23.4 | 37.2 | 4.3 |
| Example 22 | 33.3 | 20.8 | 37.5 | 8.3 |
| Example 23 | 42.8 | 7.2 | 44.3 | 5.7 |
| Example 24 | 33.8 | 27.5 | 33.8 | 5.0 |
| Example 25 | 36.4 | 22.7 | 36.4 | 4.5 |
| Example 26 | 33.3 | 23.6 | 34.7 | 8.3 |

TABLE 1-continued

| | Parts by mass per 100 parts by mass of (A) + (B) + (C) + (D) | | | |
|---|---|---|---|---|
| | (E) | (F) | (G) | (H) |
| Example 1 | — | — | — | — |
| Example 2 | — | — | — | — |
| Example 3 | — | — | — | — |
| Example 4 | — | — | — | — |
| Example 5 | — | — | — | — |
| Example 6 | 11.1 | — | — | — |
| Example 7 | 9.5 | 9.5 | — | — |
| Example 8 | 8.3 | 8.3 | 2.4 | — |
| Example 9 | 8.3 | — | 2.4 | 8.3 |
| Example 10 | 8.3 | — | 2.4 | 8.3 |
| Example 11 | — | — | — | — |
| Example 12 | — | — | — | — |
| Example 13 | — | — | — | — |
| Example 14 | — | — | — | — |
| Example 15 | — | — | — | — |
| Example 16 | — | — | — | — |
| Example 17 | — | — | — | — |
| Example 18 | — | — | — | — |
| Example 19 | 2.0 | — | — | — |
| Example 20 | 33.3 | — | — | — |
| Example 21 | 5.3 | 1.1 | — | — |
| Example 22 | 13.5 | 94.8 | — | — |
| Example 23 | 28.6 | 14.3 | 0.071 | — |
| Example 24 | 21.3 | — | 3.8 | — |
| Example 25 | 8.0 | — | 2.3 | 3.4 |
| Example 26 | 6.9 | — | 2.8 | 29.2 |

TABLE 2

| | Viscosity (mPa·s) | Sensitivity (mJ/cm$^2$) | Volume shrinkage ratio (%) | Contact angle (°) | Pencil hardness | Dry etching resistance (relative rate when PMMA = 1) |
|---|---|---|---|---|---|---|
| Ex. 1 | 80 | 441 | 9 | 78 | H | 0.5 |
| Ex. 2 | 41 | 315 | 10 | 79 | H | 0.5 |
| Ex. 3 | 32 | 315 | 9 | 85 | H | 0.6 |
| Ex. 4 | 37 | 315 | 12 | 82 | H | 0.5 |
| Ex. 5 | 35 | 315 | 10 | 79 | H | 0.6 |
| Ex. 6 | 40 | 284 | 9 | 80 | H | 0.5 |
| Ex. 7 | 66 | 284 | 9 | 80 | 2H | 0.4 |
| Ex. 8 | 62 | 284 | 9 | 97 | 2H | 0.4 |
| Ex. 9 | 109 | 284 | 8 | 93 | H | 0.5 |
| Ex. 10 | 116 | 284 | 7 | 91 | H | 0.5 |
| Ex. 11 | 22 | 567 | 13 | 79 | 4B | 0.9 |
| Ex. 12 | 76 | 252 | 11 | 77 | — | — |
| Ex. 13 | 45 | 378 | 12 | 69 | H | 0.4 |
| Ex. 14 | — | — | — | — | — | — |
| Ex. 15 | — | — | — | — | — | — |
| Ex. 16 | 15 | 1260 | 22 | 71 | — | — |
| Ex. 17 | 45 | Uncured | — | — | — | — |
| Ex. 18 | — | — | — | — | — | — |
| Ex. 19 | 39 | 315 | 10 | 77 | H | 0.5 |
| Ex. 20 | 37 | 252 | 13 | 76 | F | 0.6 |
| Ex. 21 | 40 | 284 | 9 | 79 | H | 0.5 |
| Ex. 22 | 215 | 284 | 14 | 78 | 4H | 0.3 |
| Ex. 23 | 72 | 252 | 9 | 75 | 2H | 0.4 |
| Ex. 24 | 35 | 315 | 9 | 91 | F | 0.5 |
| Ex. 25 | 82 | 284 | 9 | 97 | H | 0.5 |
| Ex. 26 | 298 | 378 | 7 | 93 | F | 0.6 |

Example 27

At 25° C., one drop of the photocurable composition in Example 2 was dropped on a silicon wafer, to obtain a silicon wafer uniformly coated with the composition. A quartz mold having a concave portion with a width of 800 nm, a depth of 180 nm and a length of 10 μm on its surface was pressed on the photocurable composition on the silicon wafer and then pressed under 0.5 MPa (gauge pressure) as it was.

Then, at 25° C., the photocurable composition was irradiated with light from a high pressure mercury lamp (a light source having dominant wavelengths at 255, 315 and 365 nm at from 1.5 to 2.0 kHz) for 15 seconds from the mold side to obtain a cured product of the photocurable composition. At 25° C., the mold was separated from the silicon wafer to obtain a molded product comprising a cured product having a convex portion reverse of the concave portion of the mold on its surface, formed on the surface of the silicon wafer. The height from the bottom face of the convex portion to the top face was from 178 to 180 nm.

INDUSTRIAL APPLICABILITY

A molded product with a fine pattern on its surface obtainable by the production method of the present invention is useful as an optical element, an anti-reflection component, biochips, microreactor chips, a recording medium, a carrier for a catalyst, a replica mold for production, a resist, etc.

The entire disclosure of Japanese Patent Application No. 2007-162466 filed on Jun. 20, 2007 including specification, claims, drawings and summary is incorporated herein by reference in its entirety.

What is claimed is:

1. A photocurable composition comprising a compound (A) which is an aromatic compound having at least two rings and which has two (meth)acryloyloxy groups, a compound (B) having a fluorine atom and having at least one carbon-carbon unsaturated double bond (excluding the compound (A)), a compound (C) having one (meth)acryloyloxy group (excluding the compound (B)) and a photopolymerization initiator (D), in amounts of the compound (A) of from 15 to 60 mass %, the compound (B) of from 5 to 40 mass %, the compound (C) of from 10 to 55 mass % and the photopolymerization initiator (D) of from 1 to 12 mass % based on the total amount (100 mass %) of the compound (A), the compound (B), the compound (C) and the photopolymerization initiator (D), wherein compound (A) consists of atoms selected from the group consisting of carbon, hydrogen, and oxygen; and wherein the photocurable composition further comprises a fluorinated surfactant (G) in an amount of from 0.1 to 3 parts by mass per 100 parts by mass of the total amount of the compound (A), the compound (B), the compound (C) and the photopolymerization initiator (D), and wherein the amount of the compound (B) is from 0.5 to 100 times the total mass of the fluorinated surfactant (G).

2. The photocurable composition according to claim 1, which contains substantially no solvent.

3. The photocurable composition according to claim 1, which further contains a compound (E) having two (meth)acryloyloxy groups (excluding the compounds (A) and (B)) in an amount of from 5 to 30 parts by mass per 100 parts by mass of the total amount of the compound (A), the compound (B), the compound (C) and the photopolymerization initiator (D).

4. The photocurable composition according to claim 1, which further contains a compound (F) having at least three (meth)acryloyloxy groups (excluding the compound (B)) in an amount of from 5 to 90 parts by mass per 100 parts by mass of the total amount of the compound (A), the compound (B), the compound (C) and the photopolymerization initiator (D).

5. A photocurable composition comprising a compound (A) which is an aromatic compound having at least two rings and which has two (meth)acryloyloxy groups, a compound (B) having a fluorine atom and having at least one carbon-carbon unsaturated double bond (excluding the compound (A)), a compound (C) having one (meth)acryloyloxy group (excluding the compound (B)) and a photopolymerization initiator (D), in amounts of the compound (A) of from 15 to 60 mass %, the compound (B) of from 5 to 40 mass %, the compound (C) of from 10 to 55 mass % and the photopolymerization initiator (D) of from 1 to 12 mass % based on the total amount (100 mass %) of the compound (A), the compound (B), the compound (C) and the photopolymerization initiator (D), wherein compound (A) consists of atoms selected from the group consisting of carbon, hydrogen, and oxygen; and wherein the photocurable composition further comprises a fluoropolymer (H) in an amount of from 5 to 25 parts by mass per 100 parts by mass of the total amount of the compound (A), the compound (B), the compound (C) and the photopolymerization initiator (D), and wherein the amount of the compound (B) is from 0.5 to 100 times the total mass of the fluoropolymer (H).

6. A method for producing a molded product with a fine pattern on its surface, which comprises a step of bringing the photocurable composition as defined in claim 1 into contact with the surface with a pattern reverse of the fine pattern of a mold having the reverse pattern formed on its surface, a step of irradiating the photocurable composition with light in a state where the photocurable composition is in contact with the surface of the mold to cure the photocurable composition thereby to obtain a cured product, and a step of separating the mold from the cured product to obtain the molded product with a fine pattern on its surface.

7. A method for producing a molded product with a fine pattern on its surface, which comprises a step of disposing the photocurable composition as defined claim 1 to the surface of a substrate, a step of pressing a mold having a pattern reverse of the fine pattern on its surface on the photocurable composition so that the reverse pattern of the mold is in contact with the photocurable composition, a step of irradiating the photocurable composition with light in a state where the mold is pressed on the photocurable composition to cure the photocurable composition thereby to obtain a cured product, and a step of separating the mold, or the substrate and the mold, from the cured product to obtain the molded product with a fine pattern on its surface.

8. A method for producing a molded product with a fine pattern on its surface, which comprises a step of disposing the photocurable composition as defined in claim 1 to the surface with a pattern reverse of the fine pattern of a mold having the reverse pattern formed on its surface, a step of pressing a substrate on the photocurable composition, a step of irradiating the photocurable composition with light in a state where the substrate is pressed on the photocurable composition to cure the photocurable composition thereby to obtain a cured product, and a step of separating the mold, or the substrate and the mold, from the cured product to obtain the molded product with a fine pattern on its surface.

9. A method for producing a molded product with a fine pattern on its surface, which comprises a step of bringing a substrate and a mold having a pattern reverse of the fine patter on its surface into close to or into contact with each other so that the reverse pattern of the mold is on the substrate side, a step of filling the photocurable composition as defined in claim 1 between the substrate and the mold, a step of irradiating the photocurable composition with light in a state where the substrate and the mold are close to or in contact with each other to cure the photocurable composition thereby to obtain a cured product, and a step of separating the mold, or the substrate and the mold, from the cured product to obtain the molded product with a fine pattern on its surface.

10. The photocurable composition according to claim 1, wherein the compound (A) at least one selected from the group consisting of

(A1)

(A2)

11. The photocurable composition according to claim 1, wherein the compound (B) at least one selected from the group consisting of
CH$_2$=CHCOOCH$_2$CH$_2$(CF$_2$)$_6$F and
CF$_2$=CFCF$_2$C(CF$_3$)(OH)CH$_2$CH=CH$_2$.

12. The photocurable composition according to claim 1, wherein the compound (C) at least one selected from the group consisting of 13. A cured composition obtained by photocuring the composition of claim 1.

14. The photocurable composition according to claim 5, which contains substantially no solvent.

15. The photocurable composition according to claim 5, which further contains a compound (E) having two (meth)acryloyloxy groups (excluding the compounds (A) and (B)) in an amount of from 5 to 30 parts by mass per 100 parts by mass of the total amount of the compound (A), the compound (B), the compound (C) and the photopolymerization initiator (D).

16. The photocurable composition according to claim 5, which further contains a compound (F) having at least three (meth)acryloyloxy groups (excluding the compound (B)) in an amount of from 5 to 90 parts by mass per 100 parts by mass of the total amount of the compound (A), the compound (B), the compound (C) and the photopolymerization initiator (D).

17. A photocurable composition comprising a compound (A) which is an aromatic compound having at least two rings and which has two (meth)acryloyloxy groups, a compound (B) having a fluorine atom and having at least one carbon-carbon unsaturated double bond (excluding the compound (A)), a compound (C) having one (meth)acryloyloxy group (excluding the compound (B)) and a photopolymerization initiator (D), in amounts of the compound (A) of from 15 to 60 mass %, the compound (B) of from 5 to 40 mass %, the compound (C) of from 10 to 55 mass % and the photopolymerization initiator (D) of from 1 to 12 mass % based on the total amount (100 mass %) of the compound (A), the compound (B), the compound (C) and the photopolymerization initiator (D),
wherein compound (A) consists of atoms selected from the group consisting of carbon, hydrogen, and oxygen.

18. The photocurable composition according to claim 1, wherein compound (A) is at least one selected from the group consisting of a bisphenol (A) di(meth)acrylate, a modified bisphenol (A) di(meth)acrylate, an ethoxylated bisphenol F di(meth)acrylate, a tricyclodecanedimethanol di(meth)acrylate, and a fluorene di(meth)acrylate.

19. The photocurable composition according to claim 1, wherein compound (A) is at least one selected from the group consisting of an ethoxylated bisphenol (A) di(meth)acrylate, a propoxylated bisphenol A di(meth)acrylate, a propoxylated ethoxylated bisphenol (A) di(meth)acrylate, a bisphenol A glycerolate di(meth)acrylate and a bisphenol (A) propoxylate glycerolate di(meth)acrylate.

20. The photocurable composition according to claim 5, wherein compound (A) is at least one selected from the group consisting of a bisphenol (A) di(meth)acrylate, a modified bisphenol (A) di(meth)acrylate, an ethoxylated bisphenol F di(meth)acrylate, a tricyclodecanedimethanol di(meth)acrylate, and a fluorene di(meth)acrylate.

21. The photocurable composition according to claim 17, wherein compound (A) is at least one selected from the group consisting of a bisphenol (A) di(meth)acrylate, a modified bisphenol (A) di(meth)acrylate, an ethoxylated bisphenol F di(meth)acrylate, a tricyclodecanedimethanol di(meth)acrylate, and a fluorene di(meth)acrylate.

* * * * *